United States Patent [19]
Koelling et al.

[11] Patent Number: 6,115,321
[45] Date of Patent: Sep. 5, 2000

[54] SYNCHRONOUS DYNAMIC RANDOM ACCESS MEMORY WITH FOUR-BIT DATA PREFETCH

[75] Inventors: Jeffrey E. Koelling, Dallas; J. Patrick Kawamura, Richardson, both of Tex.

[73] Assignee: Texas Instruments Incorporated, Dallas, Tex.

[21] Appl. No.: 09/110,620

[22] Filed: Jul. 6, 1998

[51] Int. Cl.[7] .................................................. G11C 8/00
[52] U.S. Cl. .................... 365/233; 365/189.08; 365/240; 365/230.03; 365/239
[58] Field of Search ............................. 365/233, 189.08, 365/240, 230.03, 239

[56] References Cited

U.S. PATENT DOCUMENTS

| | | | |
|---|---|---|---|
| 4,394,753 | 7/1983 | Penzel | 365/236 |
| 4,429,375 | 1/1984 | Kobayashi et al. | 365/240 |
| 4,581,721 | 4/1986 | Gunawardana | 365/230 |
| 4,618,947 | 10/1986 | Tran et al. | 365/230 |
| 4,649,511 | 3/1987 | Gdula | 364/900 |
| 4,680,738 | 7/1987 | Tam | 365/239 |
| 5,077,693 | 12/1991 | Hardee et al. | 365/230.08 |
| 5,083,296 | 1/1992 | Hara et al. | 365/230.02 |
| 5,093,807 | 3/1992 | Hashimoto et al. | 365/230.09 |
| 5,126,975 | 6/1992 | Handy et al. | 365/230.01 |
| 5,179,670 | 1/1993 | Farmwald et al. | 395/325 |
| 5,226,011 | 7/1993 | Yanagisawa | 365/189.05 |
| 5,243,703 | 9/1993 | Farmwald et al. | 395/325 |
| 5,280,594 | 1/1994 | Young et al. | 395/425 |
| 5,319,759 | 6/1994 | Chan | 395/400 |
| 5,384,745 | 1/1995 | Konishi et al. | 365/230.03 |
| 5,386,391 | 1/1995 | Watanabe | 365/233 |
| 5,390,149 | 2/1995 | Vogley et al. | 365/189 |
| 5,400,288 | 3/1995 | Hashimoto et al. | 365/221 |
| 5,587,954 | 12/1996 | Vogley et al. | 365/221 |
| 5,895,482 | 4/1999 | Toda | 711/104 |
| 5,953,278 | 9/1999 | McAdams et al. | 365/219 |

FOREIGN PATENT DOCUMENTS

| | | |
|---|---|---|
| 59-56276 | 3/1984 | Japan . |
| 59-231791 | 12/1984 | Japan . |
| 0 327 463 B1 | 8/1989 | Japan . |

OTHER PUBLICATIONS

Reese, Ed and Eddy Huang, *A Sub–10nS Cache SRAM for High Performance 32 Bit Microprocessors*, IEEE, 1990 Cust. IC Confr., pp. 24.2.1–24.2.4.

Wilson, Ron, *Will the Search for the Ideal Memory Architecture Ever End?*, Computer Design, Jul. 1, 1990, pp. 78–99.

Hochstedler, Charles, *Self–Timed SRAMs Pace High–Speed ECL Processors*, Semiconductor Memories, 1990, pp. 4–10.

(List continued on next page.)

*Primary Examiner*—David Nelms
*Assistant Examiner*—Connie C. Yoha
*Attorney, Agent, or Firm*—Robert N. Rountree; Robby T. Holland; Richard L. Donaldson

[57] ABSTRACT

A memory circuit for operating synchronously with a system clock signal is designed with a memory array (250, 252, 254, 256) having a plurality of memory cells arranged in rows and columns. Each column decode circuit of a plurality of column decode circuits (502) produces a select signal at a respective column select line (108) in response to a first column address signal. A plurality of sense amplifier circuits (202) is arranged in groups. Each sense amplifier circuit is coupled to a respective column of memory cells. Each sense amplifier circuit includes a select transistor for coupling the sense amplifier to a respective data line (203). A control terminal of each select transistor of a group of sense amplifier circuits is connected to the respective column select line. A data sequence circuit (218) is coupled to receive four data bits from four respective data lines (210, 212, 214, 216) in response to a first cycle of the system clock signal. The data sequence circuit produces four ordered data bits in response to a control signal and a second column address signal. A register circuit (220) is coupled to receive the four ordered data bits. The register circuit produces a sequence of the four ordered data bits in response to a plurality of cycles of the system clock signal after the first cycle of the system clock signal.

30 Claims, 10 Drawing Sheets

OTHER PUBLICATIONS

Lineback, J. Robert, *System Snags Shouldn't Slow the Boom in Fast Static RAMS*, Electronics, Jul. 23, 1987, pp. 60–62.

Triad Semiconductors Inc., *Static RAMs have on–chip address and Data Latches for Pipelining*, EDN, Dec. 8, 1988, p. 116.

Cole, Bernard C., *Motorola's Radical SRAM Design Speeds Systems 40%*, Electronics, Jul. 23,1987, pp. 66–68.

Iqbal, Mohammad Shakaib, *Internally Timed RAMs Build Fast Writable Control Stores*, Electronic Design, Aug. 25, 1988, pp. 93–96.

Leibson, Steven, *SRAMs' On–Chip Address and Data Latches Boost Throughput in Pipelined Systems*, EDN, Oct. 13, 1988, pp. 102–103.

M. Hashimoto, et al., Proc. IEEE, Custom IC Confr., May 4–7, 1987, pp. 315–318.

M. Hashimoto et al., Proc. IEEE, vol. 23, No. 2, Apr. 1988, pp. 490–499.

Gallant, John, Special–feature SRAMs, EDN, Jun. 20, 1991, pp. 104–112/.

Weber, Samuel, Specialty SRAMs Are Filing the Speed Gap, Electronics, May 1990, pp. 85–87.

T. Mori et al, "55 nsec, 1.3 Mb Video Memory With Rectangular Access for Graphic Systems", Electronic Information Communication Institute Technological Research Report, vol. 89, No. 69, DRAM 20 Proceeding Technology, pp. 49–54 (4740), ICD 89 26–40, Jun. 2, 1989, EIC Electronic Information Communication Institute Cooperated.

| | START | YSELECT ACTIVATION | | | |
|---|---|---|---|---|---|
| | A1A0 | 1st | 2nd | 3rd | 4th |
| SEQUENTIAL | 00 | YS0 | YS1 | YS2 | YS3 |
| | 01 | YS1 | YS2 | YS3 | YS0 |
| | 10 | YS2 | YS3 | YS0 | YS1 |
| | 11 | YS3 | YS0 | YS1 | YS2 |
| INTERLEAVE | 00 | YS0 | YS1 | YS2 | YS3 |
| | 01 | YS1 | YS0 | YS3 | YS2 |
| | 10 | YS2 | YS3 | YS0 | YS1 |
| | 11 | YS3 | YS2 | YS1 | YS0 |

FIG. 6A

| | START | YSELECT ACTIVATION | | | | | | | |
|---|---|---|---|---|---|---|---|---|---|
| | A2A1A0 | 1st | 2nd | 3rd | 4th | 5th | 6th | 7th | 8th |
| SEQUENTIAL | 000 | YS0 | YS1 | YS2 | YS3 | YS4 | YS5 | YS6 | YS7 |
| | 001 | YS1 | YS2 | YS3 | YS4 | YS5 | YS6 | YS7 | YS0 |
| | 010 | YS2 | YS3 | YS4 | YS5 | YS6 | YS7 | YS0 | YS1 |
| | 011 | YS3 | YS4 | YS5 | YS6 | YS7 | YS0 | YS1 | YS2 |
| | 100 | YS4 | YS5 | YS6 | YS7 | YS0 | YS1 | YS2 | YS3 |
| | 101 | YS5 | YS6 | YS7 | YS0 | YS1 | YS2 | YS3 | YS4 |
| | 110 | YS6 | YS7 | YS0 | YS1 | YS2 | YS3 | YS4 | YS5 |
| | 111 | YS7 | YS0 | YS1 | YS2 | YS3 | YS4 | YS5 | YS6 |
| INTERLEAVE | 000 | YS0 | YS1 | YS2 | YS3 | YS4 | YS5 | YS6 | YS7 |
| | 001 | YS1 | YS0 | YS3 | YS2 | YS5 | YS4 | YS7 | YS6 |
| | 010 | YS2 | YS3 | YS0 | YS1 | YS6 | YS7 | YS4 | YS5 |
| | 011 | YS3 | YS2 | YS1 | YS0 | YS7 | YS6 | YS5 | YS4 |
| | 100 | YS4 | YS5 | YS6 | YS7 | YS0 | YS1 | YS2 | YS3 |
| | 101 | YS5 | YS4 | YS7 | YS6 | YS1 | YS0 | YS3 | YS2 |
| | 110 | YS6 | YS7 | YS4 | YS5 | YS2 | YS3 | YS0 | YS1 |
| | 111 | YS7 | YS6 | YS5 | YS4 | YS3 | YS2 | YS1 | YS0 |

SYNCHRONOUS DYNAMIC RANDOM ACCESS MEMORY WITH FOUR-BIT DATA PREFETCH

FIELD OF THE INVENTION

This invention relates to an integrated circuit and more particularly to an integrated circuit with four-bit data prefetch.

BACKGROUND OF THE INVENTION

Present complementary metal oxide semiconductor (CMOS) synchronous dynamic random access memory (SDRAM) circuits are frequently used for main memory in a variety of applications including desk top and portable computer systems. Advances in system technology have greatly increased demand for high-speed under various modes of operation of these SDRAM circuits. These SDRAM circuits must provide wide data paths of at least 32-bits for typical memory systems. Data flow at each bit position of a 32-bit data word must function under existing 1-, 2-, 4-, and 8-bit serial and interleaved burst modes at high system clock frequencies. At these high clock frequencies, however, there is insufficient time for each data bit to flow from a sense amplifier in a memory array to an output terminal. For example, at a clock frequency of 300 MHz, one data bit is produced at each bit position every 3.33 Ns. Moreover, if the data rate is doubled, and a data bit is produced at each edge of the system clock, only 1.67 Ns is available for each data bit. By way of comparison, a typical read array time, or time for one data bit to flow from a sense amplifier to an output buffer, may be 5.3 Ns. A typical write array time, or time for one data bit to flow from an input buffer to a sense amplifier, may be 9.5 Ns. Current JEDEC specifications for pipeline and 2-bit prefetch operation help reduce the data rate problem but cannot meet future demands. Moreover, future architecture requirements must continue to function under existing SDRAM operational modes.

SUMMARY OF THE INVENTION

These problems are resolved by a memory circuit for operating synchronously with a system clock signal. The memory circuit has a memory array with a plurality of memory cells arranged in rows and columns. Each column decode circuit of a plurality of column decode circuits produces a select signal at a respective column select line in response to a first column address signal. A plurality of sense amplifier circuits is arranged in groups. Each sense amplifier circuit is coupled to a respective column of memory cells. Each sense amplifier circuit includes a select transistor for coupling the sense amplifier to a respective data line. A control terminal of each select transistor of a group of sense amplifier circuits is connected to a respective column select line. A data sequence circuit is coupled to receive four data bits from four respective data lines in response to a first cycle of the system clock signal. The data sequence circuit produces four ordered data bits in response to a control signal and a second column address signal. A register circuit is coupled to receive the four ordered data bits. The register circuit produces a sequence of the four ordered data bits in response to a plurality of cycles of the system clock signal after the first cycle of the system clock signal.

The present invention produces four data bits for each bit position in response, to a single column address. The data bits are produced in a predetermined order in response to a plurality of system clock cycles.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
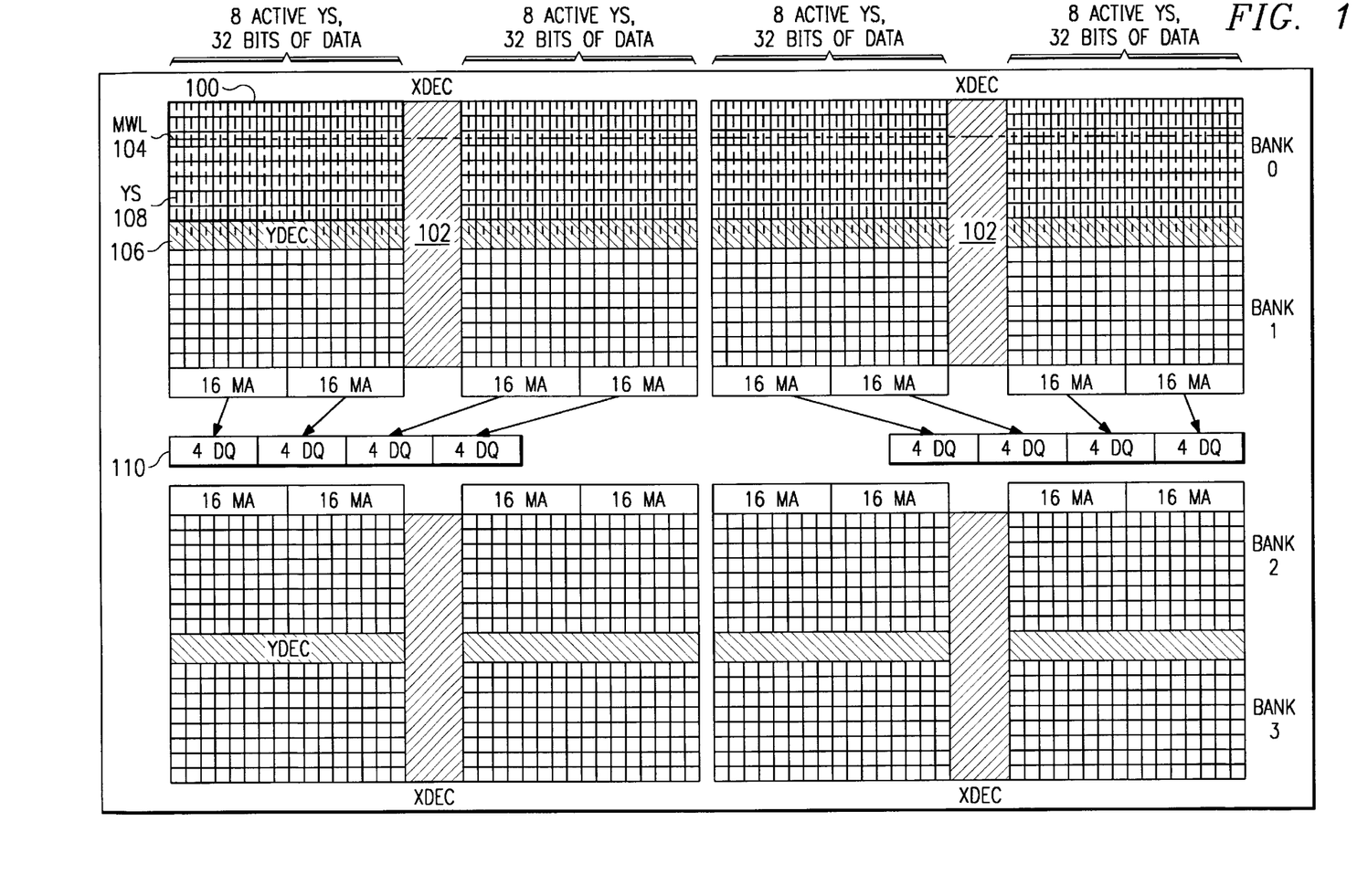
FIG. 1 is a diagram of a 256 Megabit SDRAM which may employ the present invention.

Referring now to FIG. 1, a 256 Megabit SDRAM memory circuit which may employ the instant invention will be described in detail. The memory circuit includes four quadrants of memory cells. Each quadrant of memory cells is arranged in Banks 0–3. Each bank of each quadrant, for example 100, has 16 Megabits of memory cells (excluding redundancy) and is further subdivided into eight rows and sixteen columns of matrices of memory cells. All four quadrants of one bank of memory cells are activated during a memory read or write operation.

Each memory read operation begins when a main word line, for example MWL 104, is activated. Sub-word lines (not shown) along main word line 104 are activated in alternating columns of a row of matrices of memory cells for selecting respective rows of memory cells. Sense amplifiers (not shown) amplify data on respective columns of memory cells along each active sub-word line. Eight active Y-select signals 108 are produced in each quadrant by column decode circuit 106. These Y-select signals selectively couple sense amplifiers to respective data paths for subsequent amplification. The amplified data bits are produced at respective data terminals DQ 110.

Figure 2:
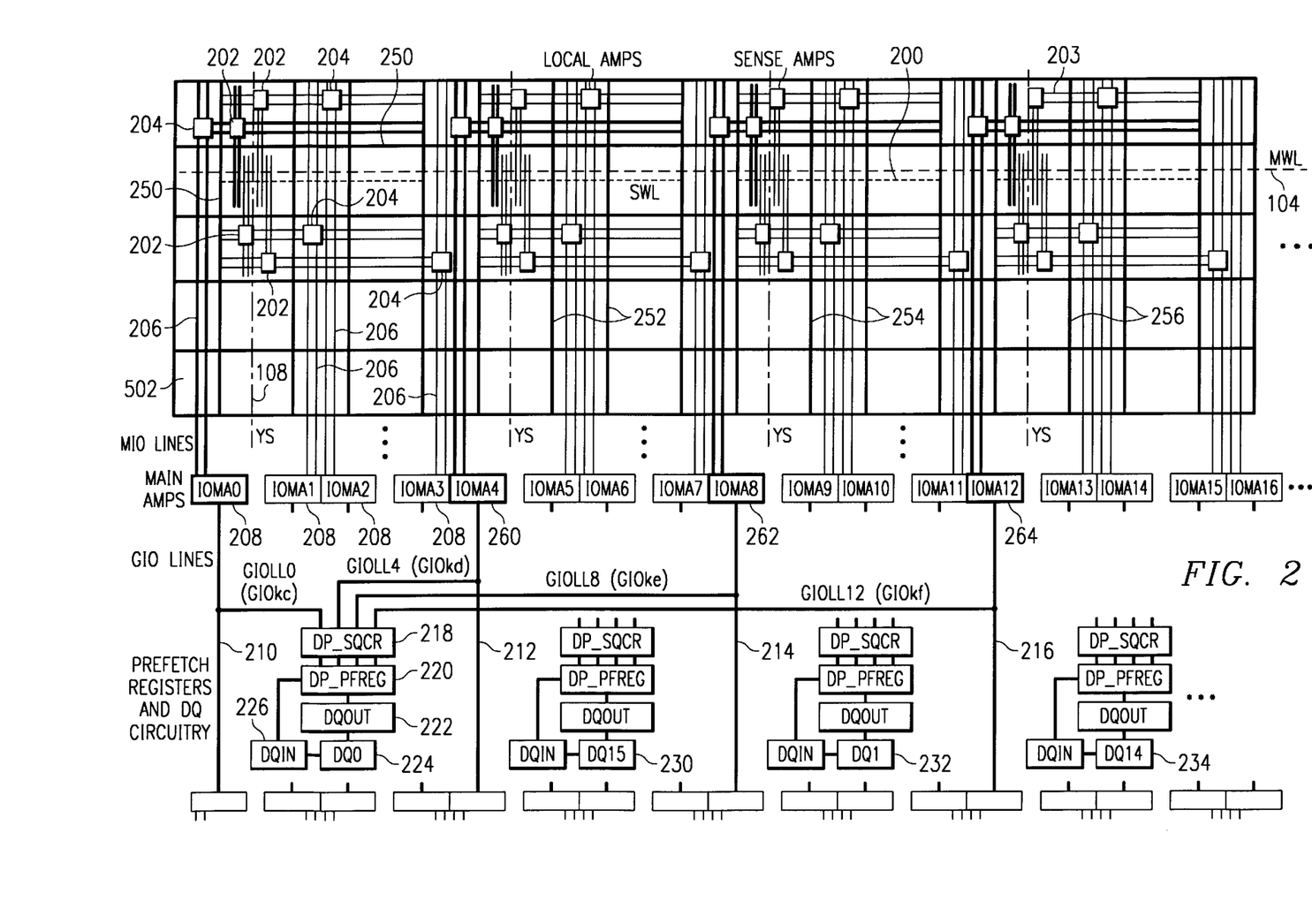
FIG. 2 is a block diagram of a part of a data path for the 256 Megabit SDRAM of FIG. 1.

Referring now to FIG. 2, there is a block diagram of a part of a data path for the 256 Megabit SDRAM of FIG. 1. A read operation begins when main word line 104 activates respective sub-word lines in each of matrices 250, 252, 254 and 256. Each of these matrices 250, 252, 254 and 256 includes two matrices in a single prefetch area. Sub-word line 200, for example, selects a row of memory cells in matrices 250. Banks of sense amplifiers adjacent matrices 250 amplify data from their respective columns along this row of memory cells. Four sense amplifiers 202 from these banks are selectively coupled to sub-I/O amplifiers 204 by sub-I/O lines in response to a Y-select signal on line 108. Data from these sub-I/O amplifiers is coupled to main amplifiers 208 by main I/O lines 206 for further amplification. Each of the main amplifiers produces a datum on a respective global I/O line. Each datum from main amplifiers 208 is routed to a different DQ terminal. Thus, data from the prefetch area including matrices 250 is routed to four different DQ terminals or bit positions in a read operation.

Data at the DQ0 bit position, for example, is produced by four main amplifiers 208, 260, 262 and 264. Data for each bit position, therefore, originates in four different prefetch areas. Although this organization is not essential to practice the instant invention, it is highly advantageous for test purposes to apply data bits selected by a single Y-select signal to different data output terminals. These data from the main amplifiers are applied to data sequence circuit 218 by global I/O lines 210, 212, 214 and 216, respectively. The data sequence circuit orders the data according to an address signal. Data prefetch register 220 receives the data and sequentially shifts it to output buffer 222.

Data flow in a write operation follows a reverse direction of a read operation. Each datum is applied to a respective data input buffer, for example 226, via DQ bond pad 224. The data is serially shifted into prefetch register 220 in response to the system clock signal. Data is then ordered by data sequence circuit 218 and applied to selected global I/O lines, main I/O lines and sub-I/O lines and written into respective sense amplifiers. These sense amplifiers write the input data to respective memory cells along the row selected by the sub-word line.

Figure 3:
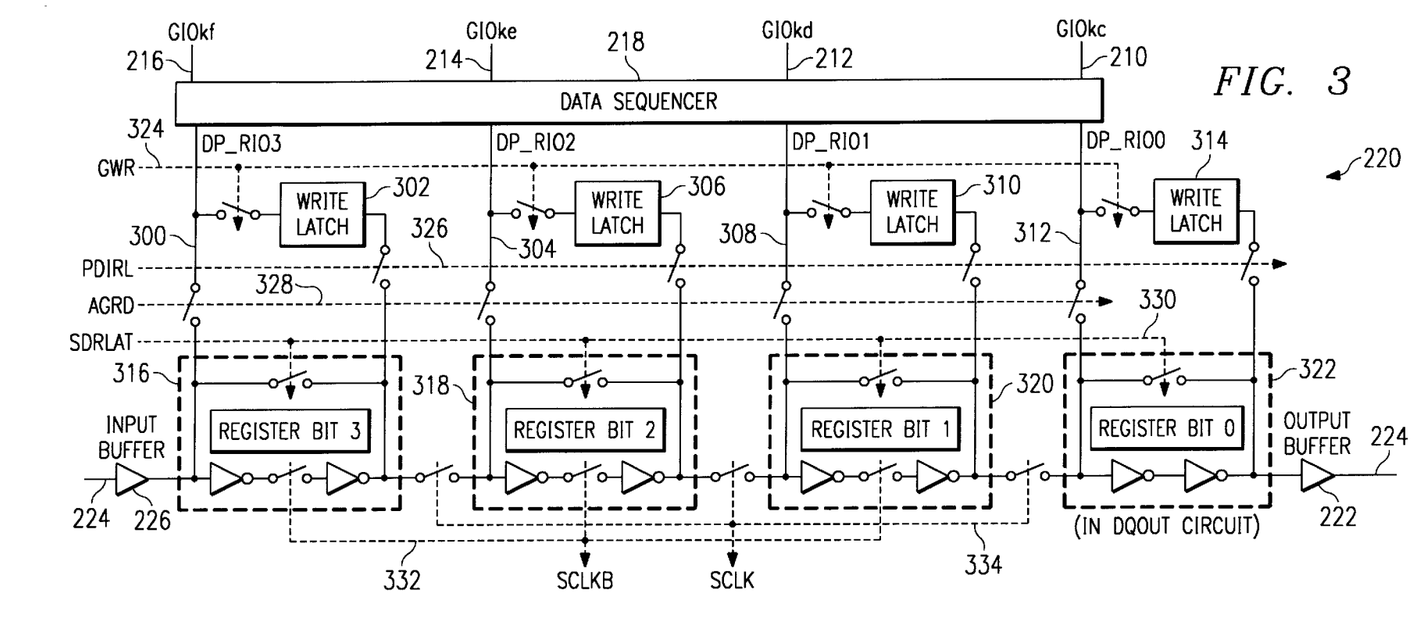
FIG. 3 is a simplified schematic diagram of prefetch register 220 of FIG. 2.

A simplified schematic diagram in FIG. 3 illustrates the operation of prefetch register 220 of FIG. 2. Prefetch register 220 receives ordered data from data sequence circuit 218 on prefetch I/O lines 300, 304, 308 and 312 during a read operation in response to an asynchronous ganged read signal AGRD on line 328. The data is latched in prefetch register 220 in response to a serial data read latch signal SDRLAT on line 330. The data is then shifted serially to the output buffer and corresponding output terminal at 224 in response to complementary clocks SCLK and SCLKB. These complementary clocks may have the same frequency as the external system clock. Alternatively, each cycle of the complementary clocks may correspond to an edge of the external system clock.

A write operation requires application of serial data to DQ terminal 224. This input data is shifted serially into prefetch register 220 in response to complementary clocks SCLK and SCLKB. A parallel data in read latch signal PDIRL on line 326 latches the data in respective write latches 302, 306, 310 and 314. A ganged write signal GWR on line 324 then applies the latched write data to data sequence circuit 218 and to the respective global I/O lines.

Figure 4:
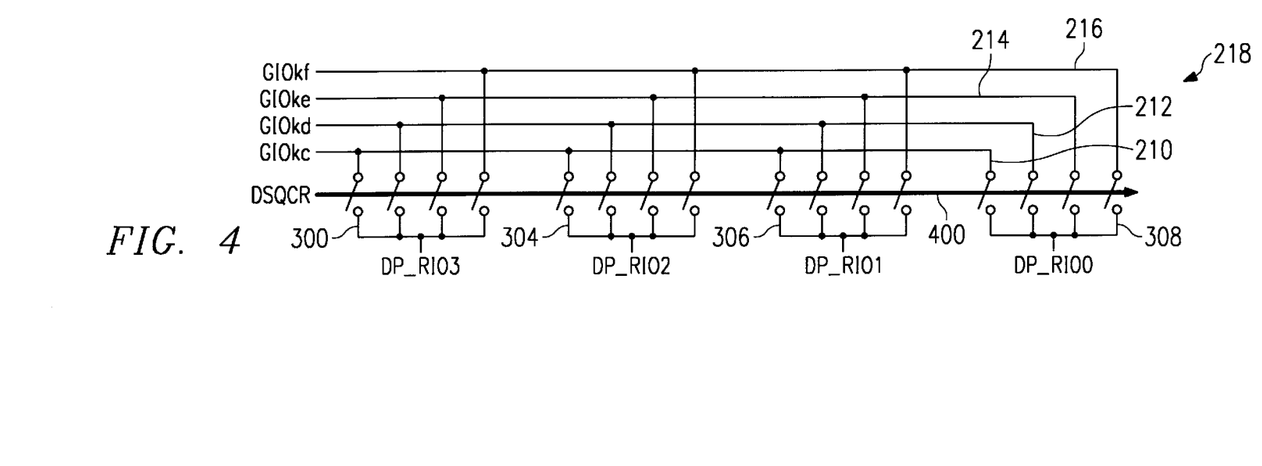
FIG. 4 is a simplified schematic diagram of data sequence circuit 218 of FIG. 2.

The data sequence circuit operation is illustrated by a simplified schematic diagram in FIG. 4. Each global I/O line is selectively coupled to a respective prefetch I/O line in response to an address signal on data sequence bus 400. The address signal determines the respective prefetch I/O line from least significant column address bits and from a control signal indicating sequential or interleaved operation. Thus, the data sequence circuit functions to multiplex any global I/O line to any prefetch I/O line for read and write operations.

Figure 5:
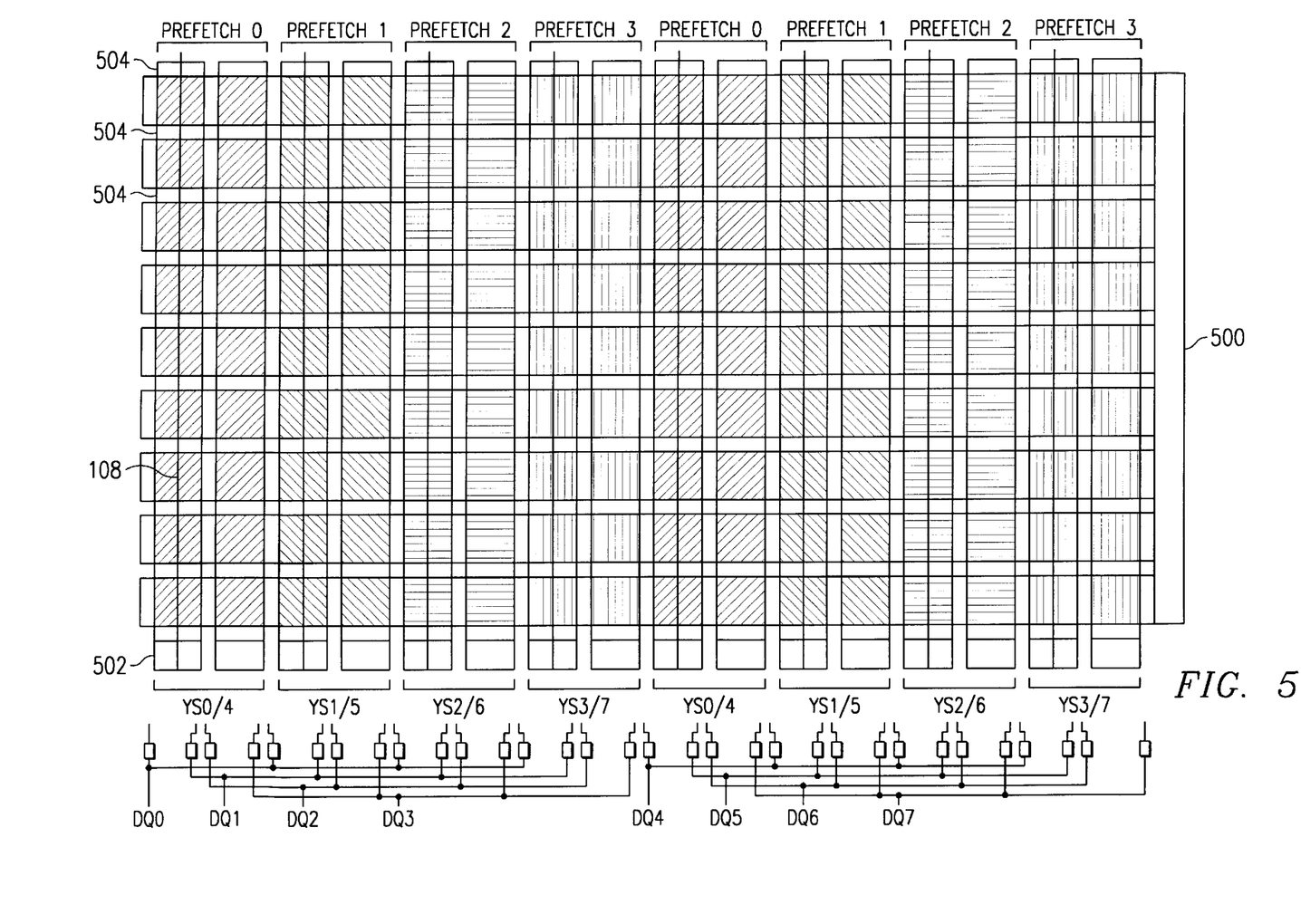
FIG. 5 is a block diagram of Bank 0 of Quadrant 1 of the 256 Megabit SDRAM of FIG. 1 showing prefetch areas.

Referring now to FIG. 5, there is a block diagram of Bank 0, Quadrant 1 of the 256 Megabit SDRAM of FIG. 1. Bank 0, Quadrant 1 includes two 8 Megabit halves. Each 8 Megabit half includes four prefetch areas 0–3. Four Y-select signals 108 are simultaneously activated in each 8 Megabit half during a read or write operation by column decode circuits 502. Each Y-select signal 108 selects four respective sense amplifiers from horizontal rows 504 for routing four data bits to four respective DQ terminals through the data path as previously described. Thus, 16 data bits are loaded into prefetch registers from the left 8 Megabit half for data terminals DQ0–DQ3. Another 16 data bits are loaded into prefetch registers from the right 8 Megabit half for data terminals DQ4–DQ7.

This arrangement simultaneously prefetches 4 data bits for each of 32 data terminals DQ0–DQ31 for a total of 128 data bits. This is sufficient for 4-bit burst mode operation. For 8-bit burst mode operation, however, a second prefetch is necessary for a total of 8 data bits. This second prefetch is accomplished by activating a second Y-select signal in the same prefetch area. It is convenient to numerically designate the Y-select signals which produce data bits for 8-bit burst mode operation by their three least significant column address bits, CA0–2. The first group of Y-select signals for prefetch areas 0–3, therefore, are YS0–YS3, respectively. Likewise, the second group of Y-select signals for prefetch areas 0–3 are YS4–YS7, respectively.

Figure 6A:
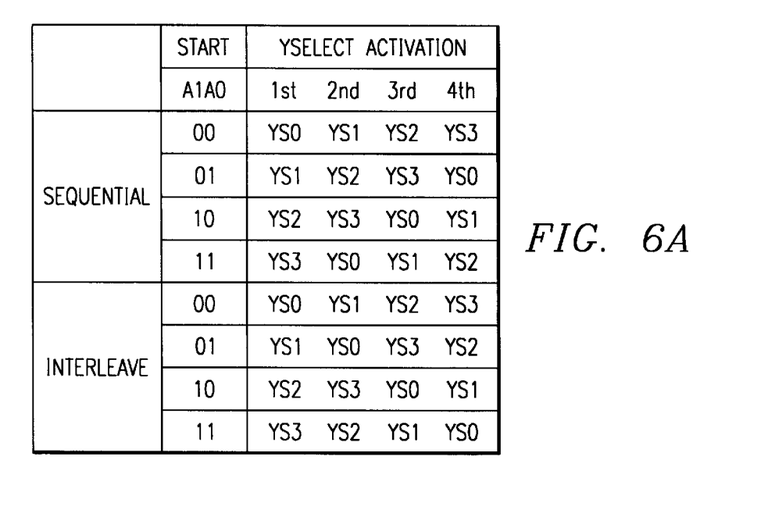
FIG. 6A is a diagram showing the order of data bits for 4-bit sequential and interleaved operation from each prefetch register in terms of Y-select signals which produce the data bits.

The diagram of FIG. 6A shows the order of data bits for 4-bit sequential and interleaved operation from each prefetch register in terms of Y-select signals which produce the data bits. For example, where initial column address bits CA1 and CA0 have a binary value 01, respectively, a first data bit from a prefetch register during 4-bit sequential operation is from Y-select signal YS1. Subsequent data bits are produced by the prefetch register in a binary counting sequence and originate from sense amplifiers selected by Y-select signals YS2, YS3 and YS0, respectively. For 4-bit interleaved operation with the same binary starting address, however, the sequence of data bits has an order YS1, YS0, YS3 and YS2 as determined by the data sequence circuit. Thus, data bits for either 4-bit sequential or interleaved operation are produced by the same group of Y-select signals. The order for each mode, however, may be different as determined by the data sequence circuit.

Figure 6B:
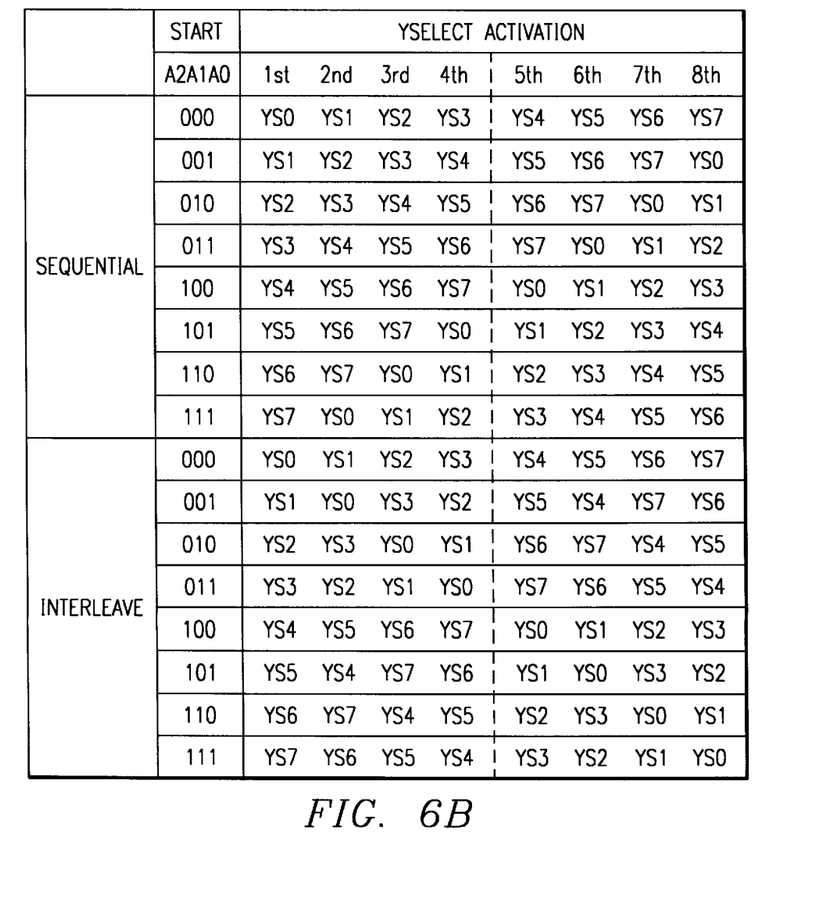
FIG. 6B is a diagram showing the order of data bits for 8-bit sequential and interleaved operation from each prefetch register in terms of Y-select signals which produce the data bits.

The diagram of FIG. 6B shows the order of data bits for 8-bit sequential and interleaved operation from each prefetch register in terms of Y-select signals which produce the data bits. Two 4-bit prefetch operations are required for an 8-bit burst length. Data bits for the first prefetch operation are selected simultaneously at a first time by a first group of 1st–4th Y-select signals. Data bits for the second prefetch operation are selected simultaneously at a second time by a second group of 5th–8th Y-select signals. The first and second groups of Y-select signals are determined by column address bit CA2 for 8-bit interleaved burst operation. Thus, Y-select signals YS0–YS3 are in the first group when column address bit CA2 has a low logic state and in the second group when column address bit CA2 has a high logic state. Alternatively, Y-select signals YS4–YS7 are in the first group when column address bit CA2 has a high logic state and in the second group when column address bit CA2 has a low logic state. For 8-bit interleaved operation, therefore, the data sequence circuit orders the data bits loaded in the prefetch register in the same manner as for 4-bit interleaved operation.

The first and second prefetch groups of Y-select signals may not be determined only by column address bit CA2 for 8-bit sequential operation. For example, where initial column address bits CA2, CA1 and CA0 have a binary value 010, first and second data bits are produced by Y-select signals YS2 and YS3, respectively, which correspond to the first group for interleaved operation. The third and fourth data bits, however, are produced by Y-select signals YS4 and YS5, respectively, which correspond to the second group for interleaved operation. Thus, the data sequence circuit alone cannot properly order the sequence of data bits for both 8-bit sequential and interleaved modes of operation.

A comparison of logic equations for generation of Y-select signals for 8-bit sequential and interleaved operation is illustrated in Table I. A first group of Y-select signals YS0–YS3 selects the first 4-bit prefetch for 8-bit interleaved operation for a low logic state of column address bit CA2. A second group of Y-select signals YS4–YS7 selects the second 4-bit prefetch for 8-bit interleaved operation for a high logic state of column address bit CA2. Sequential operation, however, requires production of each data bit in a binary counting sequence according to the three least significant column address bits CA2, CA1 and CA0. First and second prefetch group Y-select signals for 8-bit sequential operation are the same as for 8-bit interleaved operation only where burst starting column addresses CA2, CA1 and CA0 have binary values 000 or 100, respectively. Furthermore, only Y-select signals YS3 and YS7 may be determined by column address bit CA2. Thus, different Y-select signals for each 4-bit prefetch group must be activated if the memory circuit is to perform 8-bit sequential and interleaved burst mode operations.

TABLE I

| Y-SELECT | INTERLEAVED | SEQUENTIAL |
|---|---|---|
| YS0 | A2B | A2B · A1B · A0B + A2 · A1 + A2 · A0 |
| YS1 | A2B | A2B · A1B + A2 · A1 |
| YS2 | A2B | A2B · A0B + A2B · A1B + A2 · A1 · A0 |
| YS3 | A2B | A2B |
| YS4 | A2 | A2 · A1B · A0B + A2B · A1 + A2B · A0 |
| YS5 | A2 | A2B · A1 + A2 · A1B |
| YS6 | A2 | A2 · A0B + A2 · A1B + A2B · A1 · A0 |
| YS7 | A2 | A2 |

Figure 7:
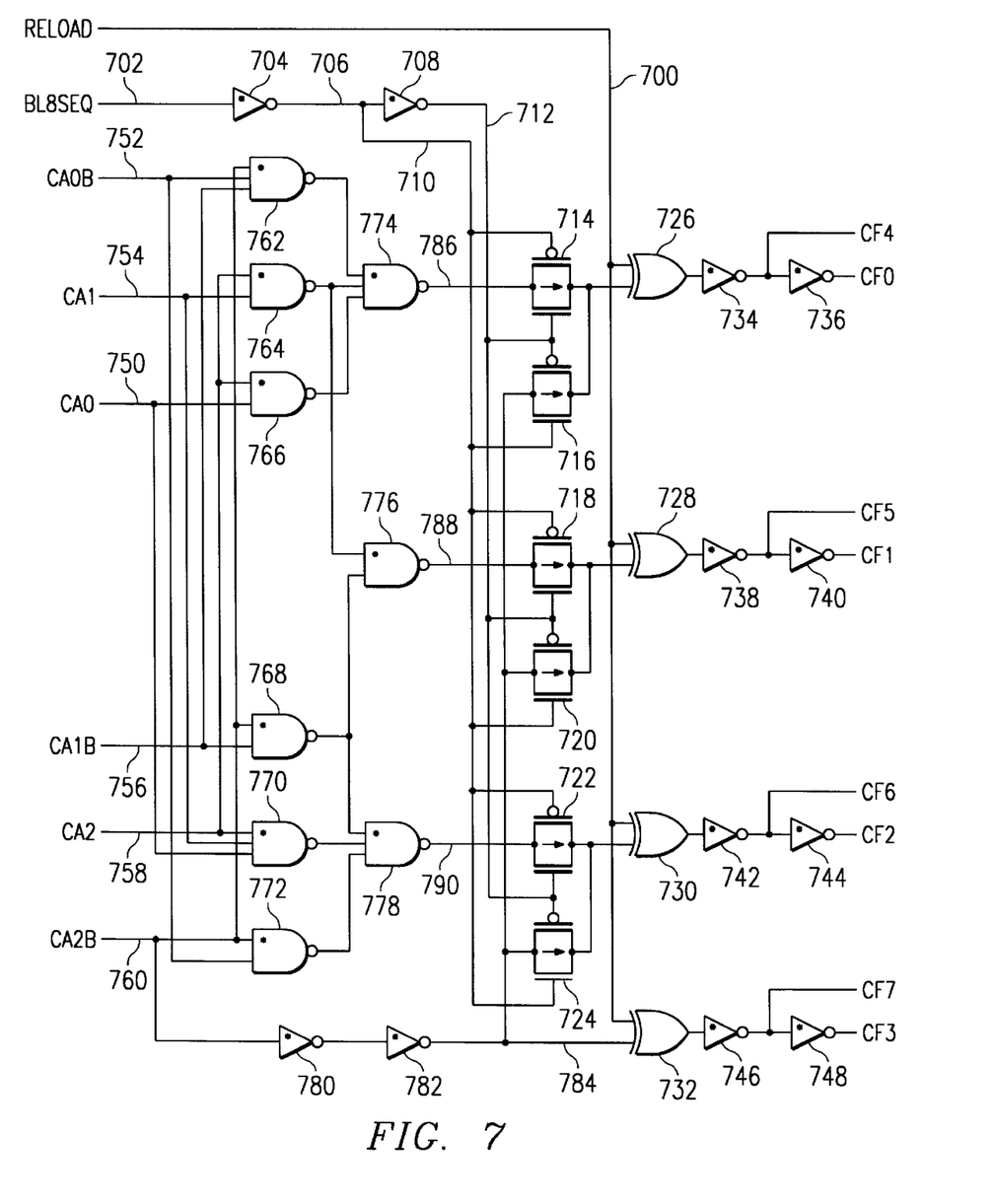
FIG. 7 is a schematic diagram of a combinatorial circuit of the instant invention for producing column factor address signals which produce the Y-select signals of FIG. 6A and FIG. 6B.

Referring now to FIG. 7, there is a schematic diagram of a circuit of the instant invention for producing column factor address signals which produce the Y-select signals of FIG. 6A and FIG. 6B. The column factors CF0–CF7 correspond to Y-select signals YS0–YS7, respectively. Mode control signal BL8SEQ at terminal 702 is low for all operational modes except 8-bit sequential burst mode. This low logic state turns off CMOS pass gates 714, 718 and 722 and turns on CMOS pass gates 716, 720 and 724. A buffered column address signal CA2B at terminal 784, therefore, is applied to XOR gates 726, 728 and 730 through CMOS pass gates 716, 720 and 724, respectively, and to XOR gate 732 directly. Load control signal RELOAD is low for 4-bit burst mode operation, so the output of each XOR gate is the same as CA2B. Thus, column factors CF0–3 and corresponding Y-select signals YS0–YS3 are high when column address CA2 is low. Column factors CF4–7 and corresponding Y-select signals YS4–YS7 are high when column address CA2 is high. Load control signal RELOAD at terminal 700 goes high to reload a second group of 4 bits into the prefetch register for 8-bit burst operation. Mode control signal BL8SEQ remains low for an 8-bit interleaved burst. The high transition of control signal RELOAD, therefore, simply inverts the output signal of each XOR gate, thereby activating the second group of Y-select signals for the second 4-bit prefetch.

Mode control signal BL8SEQ is high for an 8-bit sequential burst. This high level turns off CMOS pass gates 716, 720 and 724 and turns on CMOS pass gates 714, 718 and 722. The logic signals of Table I are then applied to XOR gates 726, 728 and 730 through CMOS pass gates 714, 718 and 722, respectively to produce the column factors and their respective Y-selective signals. Column address CA2B is applied through inverters 780 and 782 to XOR gate 732 to produce column factors CF3 and CF7 and their respective Y-select signals YS3 and YS7. A transition of load control signal RELOAD during an 8-bit sequential burst simply inverts each XOR gate output as previously described for the 8-bit interleaved mode, thereby activating the second group of Y-select signals for the second 4-bit prefetch.

Figure 14:
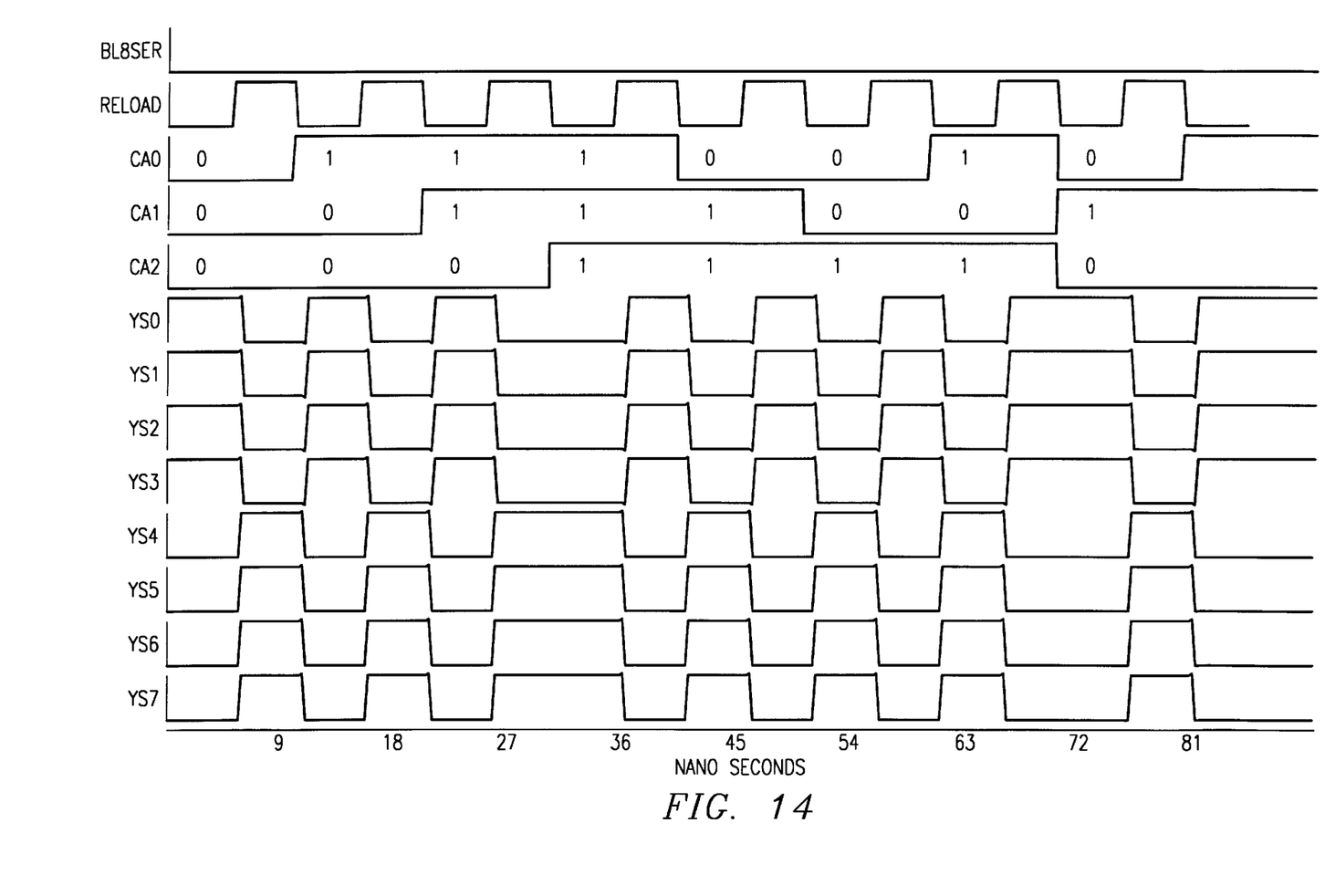
FIG. 14 is a logic simulation of the column address path of the instant invention showing the Y-select signals for each starting address for an 8-bit burst, interleave mode of operation.
Figure 15:
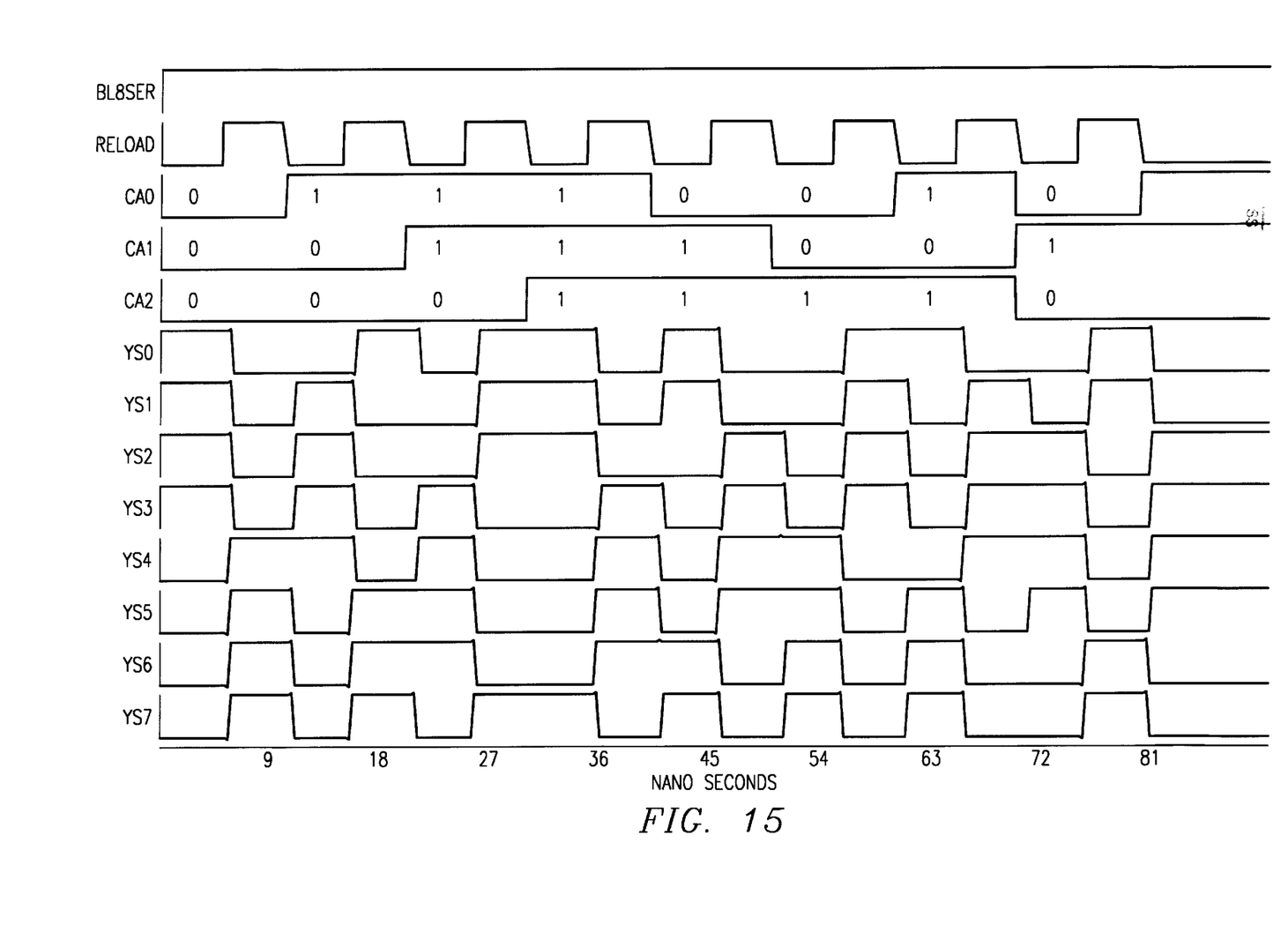
FIG. 15 is a logic simulation of the column address path of the instant invention showing the Y-select signals for each starting address for an 8-bit burst, sequential mode of operation.

A logic simulation of the circuit of FIG. 7 showing Y-select signals for each starting address for an 8-bit burst, interleaved mode operation is shown in FIG. 14. A corresponding logic simulation for an 8-bit burst, sequential mode of operation is shown in FIG. 15. This combinatorial circuit of FIG. 7 is highly advantageous in providing simplicity and speed necessary for high system clock frequencies. Moreover, it is compatible with all existing burst lengths and operating modes for SDRAM circuits.

Figure 8:
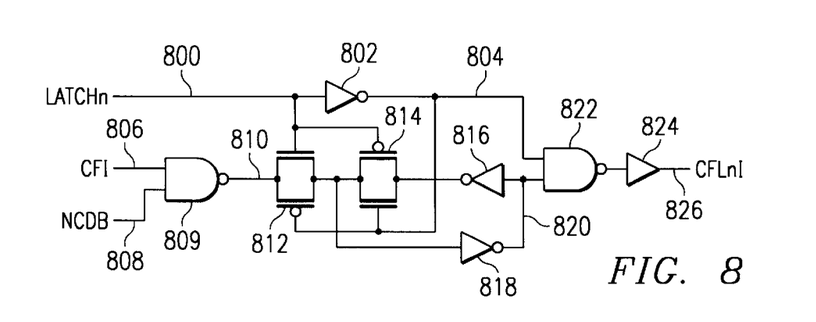
FIG. 8 is a schematic diagram of a circuit for producing latched, low-order column factor address signals.

Referring now to FIG. 8, there is a schematic diagram of a circuit for producing bank-specific, latched, low-order column factor address signals corresponding to column factors CF0–CF7. There are four of these circuits for each of the four banks of the memory circuit. Column factor signal I (FIG. 7) is applied to input terminal 806 of NAND gate 809, where I has a value 0–7 inclusive. A normal column disable signal NCDB from a redundancy circuit (not shown), applied to terminal 808, is high unless replacement of the addressed column is necessary. Latch control signal LATCHn is a logical high pulse dedicated to memory Bank n, where n has a value 0–3 inclusive. A high state of latch control signal LATCHn turns on CMOS pass gate 812 and turns off CMOS pass gate 814, applying the output signal from NAND gate 809 to the input terminal of inverter 818. A subsequent low state of latch control signal LATCHn turns off CMOS pass gate 812 and turns on CMOS pass gate 814, latching the output signal from NAND gate 809 into a latch formed by cross-coupled inverters 816 and 818. This latched output signal is applied to input terminal 820 of NAND gate 822 and produces latched, bank-specific column factor signal CFLnI when latch control signal LATCHn returns low. This latched column factor signal is buffered by noninverting buffer 824. Thus, column latched factor CFLnI has an active low logic level.

Figures 9, 10:
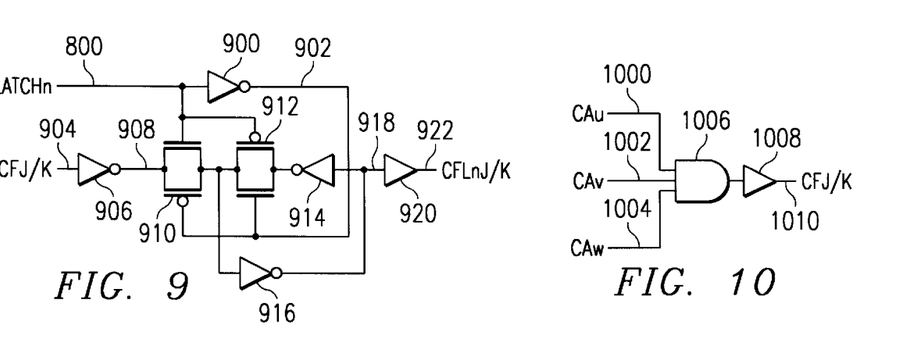
FIG. 9 is a schematic diagram of a circuit for producing latched, middle- and high-order column factor address signals.
FIG. 10 is a schematic diagram of a circuit for producing middle- and high-order column factor address signals.

Referring now to FIG. 9, there is a schematic diagram of a circuit for producing bank-specific, latched, middle- and high-order column factor address signals similar to the circuit of FIG. 8. There are sixteen of these circuits for each of the four banks of the memory circuit. A decoded column factor signal CFJ or CFK is produced by the circuit of FIG. 10 in response to column address signals CAu, CAv and CAw, where u, v and w represent a true or complementary value of three respective column address bits and J and K have a value of 4–11 and 12–19, respectively. The decoded column factor signal CFJ or CFK is latched in response to bank-specific latch control signal LATCHn at terminal 918. Buffer 920 produces latched column factor signal CFLnJ or CFLnK.

Figure 11:
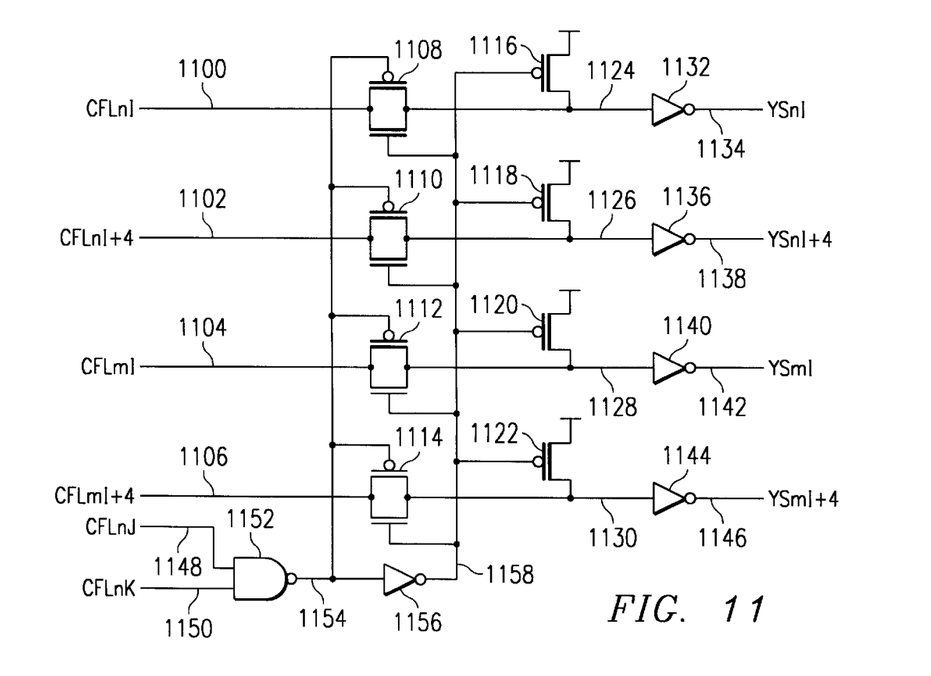
FIG. 11 is a schematic diagram of a column decode circuit for producing Y-select signals.

Referring now to FIG. 11, there is a schematic diagram of a column decode circuit for producing Y-select signals for the memory circuit. There are 2048 of these column decode circuits 106 (FIG. 1) for 2 banks of memory. The column decode circuit is selected by middle- and high-order latched column factor signals CFLnJ and CFLnK at the input terminals of NAND gate 1152. The output of NAND gate 1152 goes low when selected by high logic level column factor signals, thereby turning on CMOS pass gates 1108, 1110, 1112 and 1114. If Bank n is active, one of low-order latched column factor signals CFLnI or CFLnI+4 is low and the other is high, where n is the bank number and I has a value 0–3 inclusive. Furthermore, if Bank n is active then Bank m, having a value n+1, is inactive, and low-order latched column factor signals CFLmI and CFLmI+4 are both low. These latched column factor signals are applied to inverters 1132, 1136, 1140 and 1144 through CMOS pass gates 1108, 1110, 1112 and 1114, respectively. An active low column factor signal, for example CFLnI, then produces an active high Y-select signal YSnI at terminal 1134. This active high Y-select signal activates four pairs of select transistors (not shown) for coupling respective sense amplifiers to their respective data paths for read or write operations.

Figure 12:
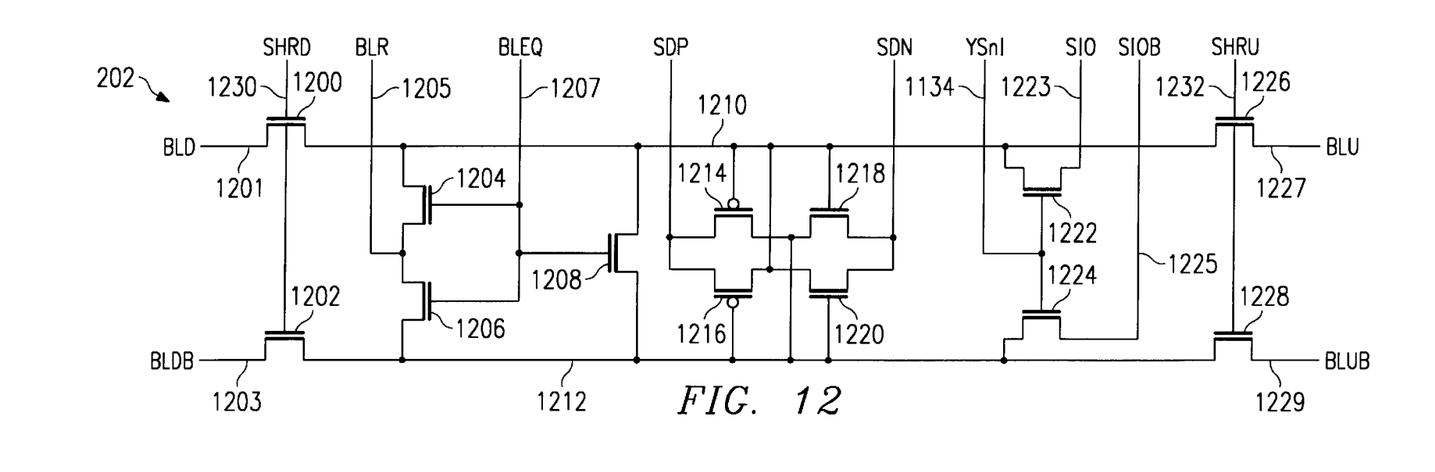
FIG. 12 is a schematic diagram of a sense amplifier of the memory circuit of FIG. 2.
Figure 13:
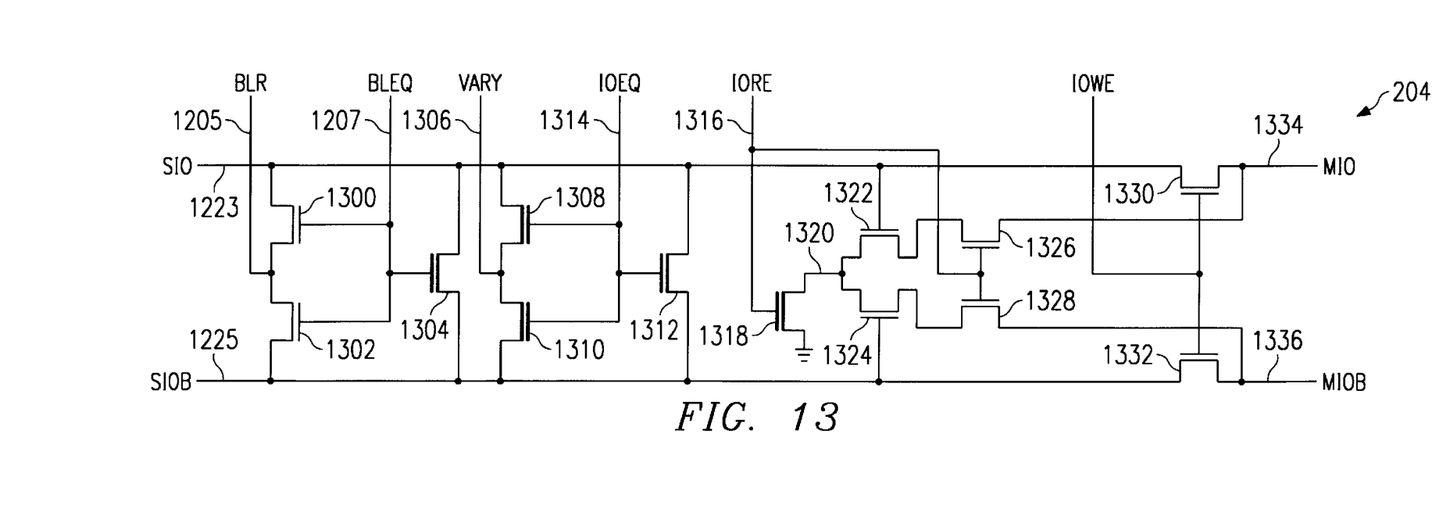
FIG. 13 is a schematic diagram of a sub-I/O amplifier of the memory circuit of FIG. 2.

Referring now to FIG. 12, there is a schematic diagram of a sense amplifier 202 of the memory circuit of FIG. 2. Sense amplifier 202 is shared between adjacent memory matrices 250 (FIG. 2). For example, when a memory matrix above sense amplifier 202 is selected, address signal SHRU at terminal 1232 is driven to a high voltage VPP that is at least an N-channel transistor threshold voltage greater than a memory array supply voltage VARY (FIG. 13). An adjacent memory matrix below sense amplifier 202 must be deselected by driving address signal SHRD low, thereby turning off select transistors 1200 and 1202. A memory cell in the selected memory matrix is selected by a word line, and the datum therein is applied to either bit line BLU or BLUB. This datum is amplified by cross-coupled sense transistors 1214, 1216, 1218 and 1220 when sense signals SDP and SDN are driven high and low respectively. The amplified datum at sense nodes 1210 and 1212 is then selectively applied to sub-I/O lines SIO and SIOB by Y-select signal YSnI at terminal 1134. During a write operation, a datum is subsequently applied to sub-I/O lines SIO and SIOB to overwrite the previous datum in sense amplifier 202. This new datum is then written to the memory cell coupled to either bit line BLU or BLUB.

After the read or write operation is completed, sense amplifier 202 is restored to a precharge condition. The active word line in the selected memory matrix is driven to ground or VSS, thereby storing the datum in the selected memory cell. Sense signals SDP and SDN are restored to bit line reference voltage BLR, intermediate array supply VARY and ground. Finally bit line equalization signal BLEQ is driven high thereby equalizing the voltage at sense nodes 1210 and 1212 and coupling them to bit line reference terminal 1205.

Referring now to FIG. 13, there is a schematic diagram of a sub-I/O amplifier 204 of the memory circuit of FIG. 2. During a read operation, sub-I/O amplifier 204 receives a datum on sub-I/O lines SIO and SIOB from sense amplifier 202. This datum is applied to control gates of sense transistors 1322 and 1324, respectively. These sense transistors are activated when I/O read enable signal IORE is driven high, thereby turning on transistor 1318 and coupling common source terminal 1320 of sense transistors 1322 and 1324 to ground. The datum on sense transistors 1322 and 1324 is then amplified and applied to main I/O lines MIO and MIOB. During write operation, I/O read enable signal IORE is low and I/O write enable signal IOWE is driven high. A datum at main I/O lines MIO and MIOB is applied to sub-I/O lines SIO and SIOB by write transistors 1330 and 1332, respectively.

Two precharge circuits are included in sub-I/O amplifier circuit 204. A first precharge circuit including transistors 1300, 1302 and 1304 equalizes and couples sub-I/O lines to bit line reference: terminal 1205 in response to a high level of bit line equalization signal BLEQ. A second precharge circuit including transistors 1308, 1310 and 1312 equalizes and couples sub-I/O lines to array voltage supply VARY in response to a high level of I/O equalization signal IOEQ. This I/O equalization signal is generated in response to a transition of a column address bit which would deactivate one Y-select signal and activate another Y-select signal. The I/O equalization step protects against inadvertently overwriting a data state of a selected sense amplifier that may have a different data state than a previously selected sense amplifier.

Although the invention has been described in detail with reference to a preferred embodiment, it is to be understood that this description is by way of example only and is not to be construed in a limiting sense. It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A memory circuit for operating synchronously with a system clock signal, comprising:

an array of memory cells arranged in rows and columns;

a first group of columns;

a second group of columns, exclusive of the first group of columns;

a third group of columns including columns from the first and second groups;

a fourth group of columns including columns from the first and second groups, exclusive of the third group of columns; and a logic circuit coupled to receive a mode control signal, a first column address signal and a second column address signal, the logic circuit arranged to produce a first group of column address signals corresponding to the first group of columns at a first time and a second group of column address signals corresponding to the second group of columns at a second time in response to a first logic state of the mode control signal, the second column address signal, and a first and a second logic state of the first column address signal, the logic circuit arranged to produce a third group of column address signals corresponding to the third group of columns at a third time, and a fourth group of column address signals corresponding to the fourth group of columns at a fourth time in response to a second logic state of the mode control signal and the first and second column address signal.

2. A memory circuit as in claim 1, wherein each group of columns comprises four columns, each group of columns producing four data bits.

3. A memory circuit as in claim 2, further comprising a data sequence circuit coupled to receive the four data bits, the data sequence circuit producing four ordered data bits in response to an address signal.

4. A memory circuit as in claim 3, wherein the data sequence circuit receives each of the four data bits from a different group of columns.

5. A memory circuit as in claim 3, further comprising a register circuit coupled to receive the four ordered data bits, the register circuit producing a sequence of four ordered data bits, responsive to a plurality of cycles of the system clock signal.

6. A memory circuit as in claim 5, further comprising an output buffer circuit coupled to receive the sequence of four ordered data bits, the output buffer circuit producing a first data bit of the sequence of four ordered data bits in response to a low-to-high transition of the system clock signal and producing a second data bit of the sequence of four ordered data bits in response to a high-to-low transition of the system clock signal.

7. A memory circuit as in claim 5, wherein the plurality of cycles begins two cycles after the first time.

8. A memory circuit as in claim 6, wherein the plurality of cycles is two cycles.

9. A memory circuit as in claim 1, wherein the logic circuit is coupled to receive a load control signal, the logic circuit arranged to select the first group of columns and the third group of columns in response to a first logic state of the load control signal, and to select the second group of columns and the fourth group of columns in response to a second logic state of the load control signal.

10. A memory circuit as in claim 9, wherein each group of columns comprises four columns, each group of columns producing four data bits.

11. A memory circuit as in claim 9, further comprising a plurality of output circuits, the output circuits coupled to simultaneously receive a first plurality of data bits from the first group of columns, the output circuits producing a first sequence of data words, responsive to a first plurality of cycles of the system clock signal.

12. A memory circuit as in claim 11, wherein the plurality of output circuits simultaneously receive a second plurality of data bits from the second group of columns, the output circuits producing a second sequence of data words, responsive to a second plurality of cycles of the system clock signal.

13. A memory circuit as in claim 12, wherein a number of data words of the sequence of data words is equal to a number of cycles of each of the first and second plurality of cycles of the system clock signal.

14. A memory circuit as in claim 13, wherein the first plurality of system clock cycles begins two cycles after the first cycle of the system clock signal, and the second plurality of system clock cycles begins two cycles after the second cycle of the system clock signal.

15. A method of addressing columns of memory cells, including the steps of:

applying an initial address signal to a logic circuit, the initial address signal including at least a first and a second address bit;

applying a first logic state of a load control signal and a first logic state of a mode control signal to the logic circuit, thereby producing a first column address signal corresponding to a first logic state of the second address bit at a first time;

selecting a first group of columns in response to the first column address signal;

applying a second logic state of the load control signal and the first logic state of the mode control signal to the decode circuit, thereby producing a second column address signal corresponding to a second logic state of the second address bit at a second time;

selecting a second group of columns in response to the second column address signal;

applying the first logic state of the load control signal and a second logic state of a mode control signal to the logic circuit, thereby producing a third column address signal corresponding to a logic state of the first and second address bits at a third time;

selecting a third group of columns in response to the third column address signal;

applying the second logic state of the load control signal and the second logic state of the mode control signal to the logic circuit, thereby producing a fourth column address signal corresponding to the logic state of the first and second address bits at a fourth time; and selecting a fourth group of columns in response to the fourth column address signal.

16. A method as in claim 15, further including the steps of:

receiving plural data bits simultaneously from the first group of columns; and applying the plural data bits in a sequence to an output circuit in synchronization with a system clock signal.

17. A method as in claim 15, further including the steps of:

receiving plural data bits simultaneously from one of the groups of columns;

ordering the plural data bits in response to an address signal;

applying the ordered plural data bits in a sequence to an output circuit in synchronization with a system clock signal; and producing the sequence of ordered plural data bits at a data output terminal.

18. A method as in claim 15, further including the steps of:

receiving plural data bits simultaneously at a plurality of data input terminals;

shifting the plural data bits in a sequence to an input circuit in synchronization with a system clock signal; and writing the plural data bits simultaneously to one of the groups of columns.

19. A method as in claim 17, wherein the step of applying the ordered plural data bits in a sequence to an output circuit in synchronization with a system clock signal comprises the steps of:

producing a first data bit of the ordered plural data bits in response to a low-to-high transition of the system clock signal; and producing a second data bit of the ordered plural data bits in response to a high-to-low transition of the system clock signal.

20. A method as in claim 15, wherein the second group of columns is exclusive of the first group of columns, the third group of columns includes columns from the first and second groups of columns, and the fourth group of columns is exclusive of the third group of columns.

21. A memory circuit for operating synchronously with a system clock signal, comprising:

an array of memory cells arranged in rows and columns;

a first group of columns;

a second group of columns;

a third group of columns;

a fourth group of columns; and a logic circuit coupled to receive a mode control signal, a first column address signal and a second column address signal, the logic circuit arranged to produce a first group of column address signals corresponding to the first group of columns at a first time and a second group of column address signals corresponding to the second group of columns at a second time in response to a first logic state of the mode control signal, the second column address signal, and a first and a second logic state of the first column address signal, the logic circuit arranged to produce a third group of column address signals corresponding to the third group of columns at a third time, and a fourth group of column address signals at a fourth time in response to a second logic state of the mode control signal and the first and second column address signal.

22. A memory circuit as in claim 21, further comprising:

a latch circuit arranged to latch the first, second, third, and fourth groups of column address signals in response to a latch control signal, thereby producing a respective plurality latched column address signals; and a column decode circuit coupled to receive the plurality of latched column address signals and at least one other column address signal, the column decode circuit arranged to produce a respective plurality of column select signals.

23. A memory circuit as in claim 21, wherein each group of columns comprises four columns, each group of columns producing four data bits.

24. A memory circuit as in claim 23, further comprising a data sequence circuit coupled to receive the four data bits, the data sequence circuit producing four ordered data bits in response to an address signal.

25. A memory circuit as in claim 24, wherein the data sequence circuit receives each of the four data bits from a different group of columns.

26. A memory circuit as in claim 24, further comprising a register circuit coupled to receive the four ordered data bits, the register circuit producing a sequence of four ordered data bits, responsive to a plurality of cycles of the system clock signal.

27. A memory circuit as in claim 26, further comprising an output buffer circuit coupled to receive the sequence of four ordered data bits, the output buffer circuit producing the sequence of four data bits at a bond pad, responsive to the plurality of cycles of the system clock signal.

28. A memory circuit as in claim 26, wherein the register circuit produces a first data bit of the sequence of four ordered data bits in response to a low-to-high transition of the system clock signal, and produces a second data bit of the sequence of four ordered data bits in response to a high-to-low transition of the system clock signal.

29. A memory circuit as in claim 21, further comprising a plurality of output circuits, the output circuits coupled to simultaneously receive a first plurality of data bits from the first group of columns, the output circuits producing a first sequence of data words, responsive to a first plurality of cycles of the system clock signal.

30. A memory circuit as in claim 29, wherein the plurality of output circuits simultaneously receive a second plurality of data bits from the second group of columns, the output circuits producing a second sequence of data words, responsive to a second plurality of cycles of the system clock signal.

* * * * *

UNITED STATES PATENT AND TRADEMARK OFFICE
CERTIFICATE OF CORRECTION

PATENT NO.   : 6,115,321
DATED        : September 5, 2000
INVENTOR(S)  : Koelling et al.

Page 1 of 1

It is certified that error appears in the above-identified patent and that said Letters Patent is hereby corrected as shown below:

On title page, after INID code [22] paragraph, insert INID code [66] paragraph as follows:

Related U.S. Application Data

[66] This application claims the benefit of U.S. Provisional Application No. 60/049,882, filed June 17, 1997

Signed and Sealed this

Twelfth Day of June, 2001

*Attest:*

*Attesting Officer*

NICHOLAS P. GODICI
*Acting Director of the United States Patent and Trademark Office*